United States Patent
Mann

(12) 
(10) Patent No.: US 6,188,255 B1
(45) Date of Patent: Feb. 13, 2001

(54) CONFIGURABLE CLOCK GENERATOR

(75) Inventor: Eric N. Mann, Issaquah, WA (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/161,821

(22) Filed: Sep. 28, 1998

(51) Int. Cl.$^7$ .............................. H03L 7/06; G06F 1/08
(52) U.S. Cl. .......................... 327/113; 327/175; 327/179; 331/16
(58) Field of Search ..................... 326/39, 41; 327/113, 327/147, 172, 175, 178, 179; 331/16, 17, 1 A, 7, 8

(56) References Cited

U.S. PATENT DOCUMENTS

| | | | |
|---|---|---|---|
| 4,816,700 | 3/1989 | Imel | 327/154 |
| 5,036,216 | 7/1991 | Hohmann et al. | 309/269 |
| 5,036,230 | 7/1991 | Bazes | 327/107 |
| 5,136,180 | 8/1992 | Caviasa et al. | 327/115 |
| 5,177,771 | 1/1993 | Glassburn | 377/39 |
| 5,233,314 | 8/1993 | McDermott et al. | 331/17 |
| 5,237,699 | 8/1993 | Little et al. | 395/750 |
| 5,256,994 | 10/1993 | Langendorf | 331/16 |
| 5,295,079 | * 3/1994 | Wong et al. | 364/484 |
| 5,307,381 | 4/1994 | Ahuja | 375/107 |
| 5,336,939 | 8/1994 | Eitrheim et al. | 327/291 |
| 5,357,204 | 10/1994 | Knoll | 327/259 |
| 5,359,232 | 10/1994 | Eitrheim et al. | 327/116 |
| 5,369,311 | 11/1994 | Wang et al. | 327/292 |
| 5,371,772 | 12/1994 | Al-Khairi | 377/47 |
| 5,389,826 | 2/1995 | Sonobe | 307/125 |
| 5,398,262 | 3/1995 | Ahuja | 375/356 |
| 5,412,349 | 5/1995 | Young et al. | 331/34 |
| 5,444,405 | 8/1995 | Truong et al. | 327/239 |
| 5,446,867 | 8/1995 | Young et al. | 395/550 |
| 5,481,697 | 1/1996 | Mathews et al. | 395/550 |
| 5,497,126 | * 3/1996 | Kosiec et al. | 331/1 A |
| 5,523,705 | * 6/1996 | Steele | 326/41 |
| 5,532,636 | 7/1996 | Mar et al. | 327/543 |
| 5,535,377 | 7/1996 | Parks | 395/550 |
| 5,537,068 | 7/1996 | Konno | 327/115 |
| 5,537,582 | 7/1996 | Draeger | 395/550 |
| 5,546,563 | 8/1996 | Chuang | 395/500 |
| 5,550,499 | 8/1996 | Eitrheim | 327/175 |
| 5,555,025 | 9/1996 | McArthur | 348/478 |
| 5,563,553 | 10/1996 | Jackson | 331/57 |
| 5,630,148 | 5/1997 | Norris | 395/750 |
| 5,638,016 | 6/1997 | Eitrheim | 327/175 |
| 5,638,542 | 6/1997 | Nikjou | 395/750 |
| 5,684,418 | 11/1997 | Yanagiuchi | 327/99 |
| 5,684,434 | * 11/1997 | Mann et al. | 327/147 |
| 5,687,202 | 11/1997 | Eitrheim | 375/376 |
| 5,696,949 | 12/1997 | Young | 395/551 |
| 5,706,484 | 1/1998 | Mozdzen et al. | 395/551 |
| 5,719,510 | 2/1998 | Weidner | 327/119 |
| 5,818,254 | * 10/1998 | Agrawal et al. | 326/39 |

* cited by examiner

*Primary Examiner*—Timothy P. Callahan
*Assistant Examiner*—Terry L. Englund
(74) *Attorney, Agent, or Firm*—Christopher P. Maiorana, P.C.

(57) ABSTRACT

A circuit and method implement a configurable clock generator comprising a logic circuit, a configurable matrix and a phase-locked loop. The logic circuit may be configured to generate a plurality of control signals. The configurable matrix may comprise a plurality of interconnections that may be configured to (i) receive the plurality of control signals from the logic circuit and (ii) bus the control signals to the phase-locked loop. The plurality of control signals may control the operation of the phase-locked loop. In one example, the logic circuit may comprise a sea of gates logic array.

19 Claims, 5 Drawing Sheets

US 6,188,255 B1

CONFIGURABLE CLOCK GENERATOR

FIELD OF THE INVENTION

The present invention relates to clock generators generally and, more particularly, to a clock generator configured to receive a series of configuration signals and generate a series of output signals bussed through programmable interconnections.

BACKGROUND OF THE INVENTION

Conventional approaches to frequency generation include constructing a clock generator that generates a fixed frequency signal. The frequency of the clock generator is determined by using a specific pattern during the manufacturing process involved in the wafer production of the clock generator. An important competitive advantage can be obtained by providing a clock generator that can be configured late in the manufacturing process, preferably after wafer fabrication. Phase-locked-loop (PLL) based clock generators typically use read only memory (ROM) tables to store frequency selection and configuration information. The frequency selection information can be altered by using a device specific mask during wafer fabrication. A disadvantage with this technique is that once the device has been fabricated, the device can no longer be re-configured. The functions of the device pins are also predefined based on the internal logic used to implement the functions.

Another conventional approach used to obtain late configuration for PLL-based clock generators is accomplished by implementing a number of electrically programmable fuses made of aluminum, polysilicon or some other type of metal that is appropriate for fuse fabrication. These fuses control gates and multiplexers provide limited configuration control. These fuses could then be programmed after production of the clock generator. The fuse technique provides somewhat of a competitive advantage by reducing the number of parts required to be stored in inventory at any given time. The late programming of the fuses also reduces the time necessary to produce the clock generator. However, this technique suffers from the disadvantage of having limited configuration information that can be stored. As a result, the implementation of clock generators that generate new frequencies or functions often requires the design and development of a new device. Some conventional approach devices can implement more than one frequency table on a single ROM, but are limited to the specific pre-defined frequencies available in the original ROM mask.

Another conventional approach that could be used to obtain late configuration of clock generators is accomplished by using floating gate storage (e.g., EPROM, EEPROM, Flash, etc.) which can be programmed by storing a charge on a floating transistor gate which forms an electrically programmable ROM to store frequency or configuration information. Also similar to the fuse technique would be the disadvantage of storing only a limited amount of configuration information.

SUMMARY OF THE INVENTION

The present invention concerns a circuit and method for implementing a configurable clock generator comprising a logic circuit, a configurable matrix and a phase-locked loop. The logic circuit may be configured to generate a plurality of control signals. The configurable matrix may comprise a plurality of interconnections that may be configured to (i) receive the plurality of control signals from the logic circuit and (ii) bus the control signals to the phase-locked loop. The plurality of control signals may control the operation of the phase-locked loop.

In one example, the logic circuit may comprise a sea of gates logic array.

The objects, features and advantages of the present invention include providing a clock generator that may be configured during or after production of the device by providing a matrix of programmable interconnections that are programmed to provide the desired device function. The programable interconnections may bus (i) the input/control signals presented to the clock generator that may control the functions of the clock generator and/or (ii) the output signals generated by the clock generator. By using the programmable interconnect matrix to configure the clock generator, a single device may be adapted to meet a much broader range of applications than the limited configurability provided by conventional approaches.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
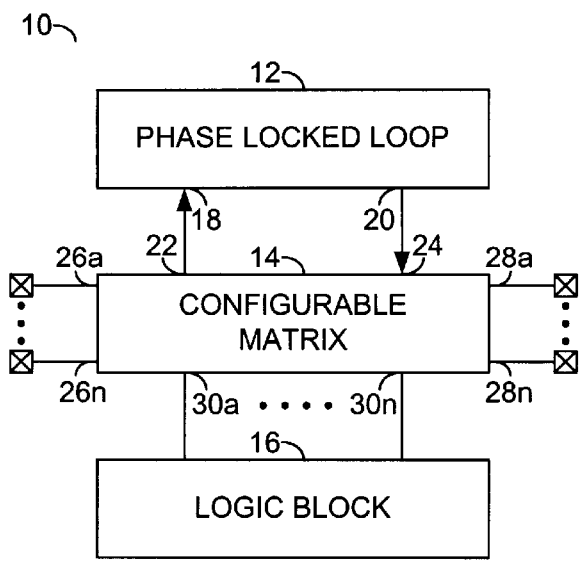
FIG. 1 is a block diagram of a circuit in accordance with a preferred embodiment of the present invention.

Referring to FIG. 1, a block diagram of a circuit 10 is shown in accordance with a preferred embodiment of the present invention. The circuit 10 generally comprises a phase-locked loop (PLL) block (or circuit) 12, a configurable matrix block (or circuit) 14 and a logic block (or circuit) 16. The logic block 16 may be implemented, in one example, as a complex programmable logic device (CPLD) or a sea of gates logic array. The PLL block 12 may have an input 18 and an output 20. The input 18 may receive signals from an output 22 of the configurable matrix block 14. The output 20 may present signals to the input 24 of the configurable matrix block 14. The signals presented at the output 20 and received at the input 18 may be a number of signals related to the operation of the PLL 12. For example, the signals received at the input 18 may be used to control one or more reference frequencies and/or one or more configuration parameters. The signals presented at the output 20 may be one or more clock frequencies and/or one or more output configuration parameters. The particular number of input parameters and output parameters will be described in more detail in connection with FIGS. 3–13.

The configurable matrix block 14 may have one or more inputs 26a–26n, one or more outputs 28a–28n, one or more inputs 30a–30n and a plurality of programmable interconnections 32a–32n. The programming of the individual programmable interconnections 32a–32n of the configurable matrix block 14 will be described in more detail in connection with FIGS. 5–13. The inputs 26a–26n generally receive control signals (e.g., CTRL0-N) and one or more reference clock signals (e.g., REFCLK0-N) that may be used by the PLL 12 to generate specific output clock signals that may oscillate at particular frequencies. The configurable matrix 14 may route the different control signals CTRL0–N and reference clock signals REFCLK0–N received at the inputs 26a–26n to particular portions of the PLL block 12. For example, if the PLL block 12 comprises a number of individual PLLs, one or more of the reference clock signals REFCLK0–N may be presented to each of the individual PLLs. An example of such a configuration will be described in more detail in connection with FIG. 2. The outputs 28a–28n may present output clock signals (e.g., CLKOUT0–N) at one or more of the outputs 28a–28n. The inputs 30a–30n may receive configuration information from the fixed logic block 16. Such parameters may include enable logic, spread spectrum sequencing logic, operating frequency selection, output divider control, output drive control, input threshold calibration, input thresholds, output drive levels, slew rate control and/or slew rate limiting, pump current, gain and/or range control, and other such parameters. Additionally the configuration signals may be used to enable a testing mode for the PLL block 12. Additional examples of such parameters may be found in U.S. Pat. No. 5,684,434 entitled "ERASABLE AND PROGRAMMABLE SINGLE CHIP CLOCK GENERATOR," which is hereby incorporated by reference in its entirety.

Figure 2:
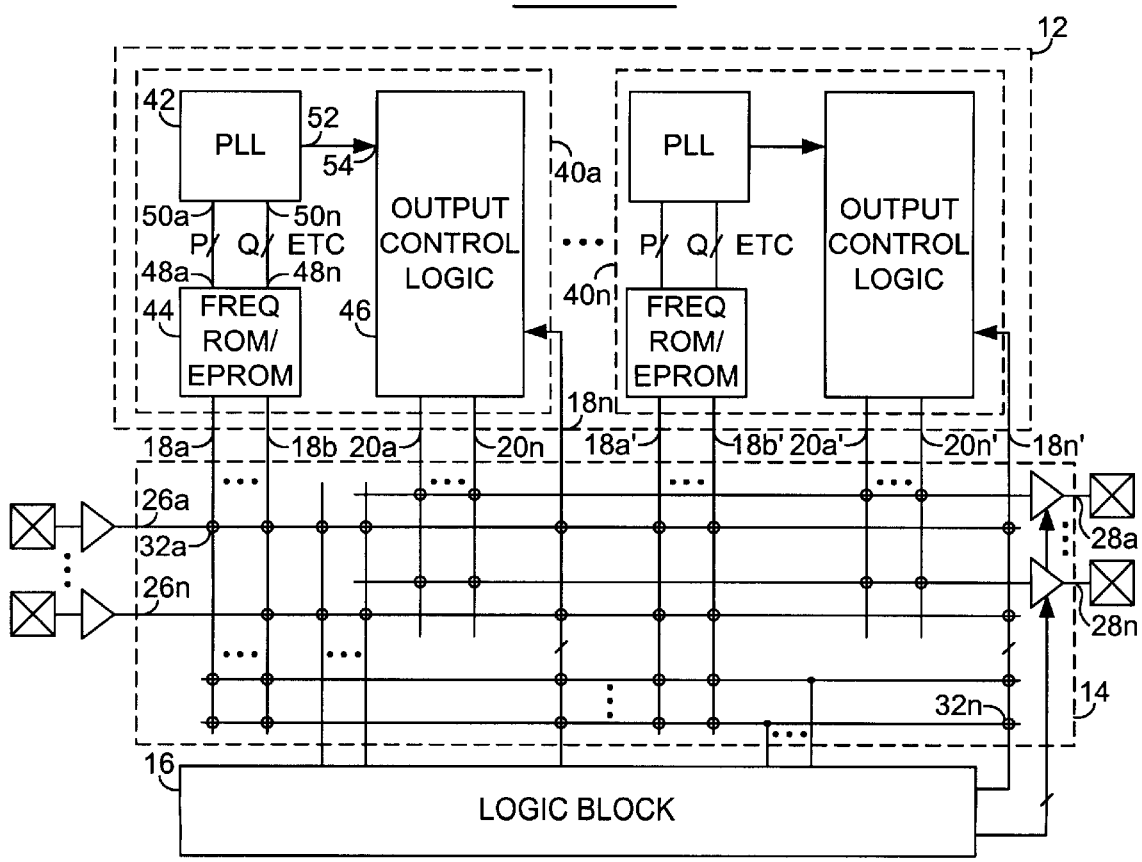
FIG. 2 is a more detailed block diagram of the circuit of FIG. 1.

Referring to FIG. 2, a more detailed diagram of the circuit 10 is shown. The PLL block 12 is shown comprising a number of PLL blocks 40a–40n. Each of the PLL blocks 40a–40n may be independently configured in response to signals received from the configurable matrix 14. The PLL block 40a is shown comprising a PLL 42, a frequency block 44 and an output control logic block 46. The frequency block 44 may be implemented as a read-only memory (ROM), an electrically programmable read-only memory (EPROM) or any other type of memory appropriate for the design criteria of a particular application. The frequency block 44 is shown receiving an input 18a and input 18b. The signals received at the inputs 18a and 18b may be used to configure the frequency block 44 to present appropriate signals at outputs 48a and 48n that may be used at the inputs 50a and 50n of the PLL 42. For example, the input 50a may receive a product signal (e.g., P) and the input 50n may receive a quotient signal (e.g., Q) that may be used by the PLL 42 to present a signal having a particular frequency of oscillation at an output 52. Other input parameters may be presented to the PLL 42 to meet the design criteria of a particular application.

The output control logic 46 may have an input 54 that may receive the signal from the output 52 of the PLL 42. The output control logic 46 may also have an input 18n that may receive configuration information from the configurable matrix 14. The output control logic 46 may present signals at the outputs 20a and 20n that may be signals oscillating at different frequencies than the signal received at the input 54. The output control logic block 46 will be described in more detail in connection with FIG. 4.

Figure 3:
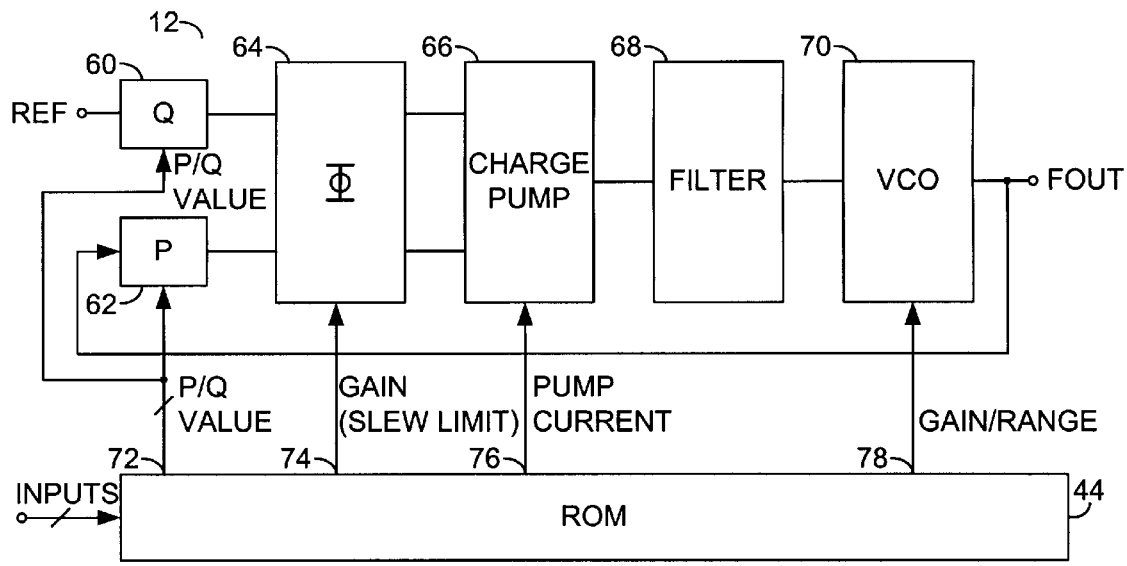
FIG. 3 is an example of a phase-locked loop implemented in the circuit of FIG. 1.

Referring to FIG. 3, an example of the phase-locked loop 12 is shown. The PLL 12 generally comprises a quotient counter block (or circuit) 60, a product counter block (or circuit) 62, a phase detector block (or circuit) 64, a charge pump block (or circuit) 66, a filter block (or circuit) 68, a voltage control oscillator (VCO) block (or circuit) 70. The ROM 44 is shown having an output 72 that may present the signal P or the signal Q to the P counter 62 or the Q counter 60, respectively. The ROM 44 also has an output 74 that may present a control signal to the phase detector 64, an output 76 that may present a control signal to the charge pump 66, and an output 78 that may present a signal to the VCO 70. The signal presented at the output 74 may control parameters such as slew rate control and/or slew rate limiting. The signal presented at the output 76 may control parameters such as pump current. The signal presented at the output 78 may control parameters such as gain or range control.

Figure 4:
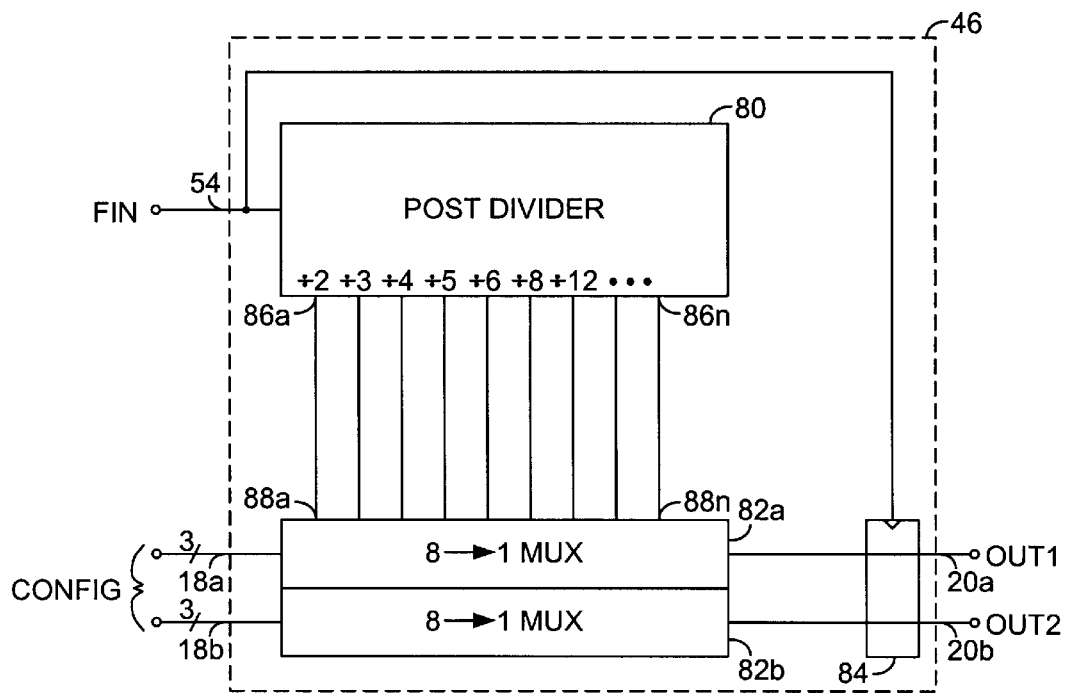
FIG. 4 is an example of an output control logic implemented in the circuit of FIG. 1.

Referring to FIG. 4, a diagram of the output control logic 46 is shown. A signal Fin is shown received at the input 54. The output control logic 46 generally comprises a post divider block (or circuit) 80, a multiplexer block (or circuit) 82a, and a multiplexer block (or circuit) 82b. The post divider block 80 receives the signal Fin and may present a number of divided signals and a number of outputs 86a–86n. The signals presented at the outputs 86a–86n may be received at a number of inputs 88a–88n. An output synchronizing register 84 may be used to reduce skew between the output signals 20a and 20b. The synchronization register 84 may include provisions to receive more than one clock signal. This provision may be used to receive delayed versions of clock 54 to control the frequency relationship of the outputs 20a and 20b.

Figure 5:
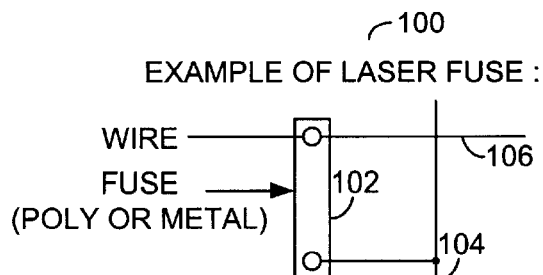
FIG. 5 is a diagram of an example of a laser fuse that may be implemented in the configurable matrix of FIG. 1.

Referring to FIG. 5, an example of a laser fuse 100 is shown having a fuse element 102 connected between a vertical wire 104 and a horizontal wire 106. The vertical wire 104 and horizontal wire 106 are generally included at the various programmable interconnections 32a–32n of the configurable matrix block 14 of FIGS. 1 and 2. When the fuse element 102 is intact, the vertical wire 104 is generally electrically connected to the horizontal wire 106. When the fuse element 102 not intact (or blown), the vertical wire 104 is not generally electrically connected to the horizontal wire 106. The fuse element 102 is generally made of a poly material or a metal material that may be blown by a device such as a laser.

Figure 6:
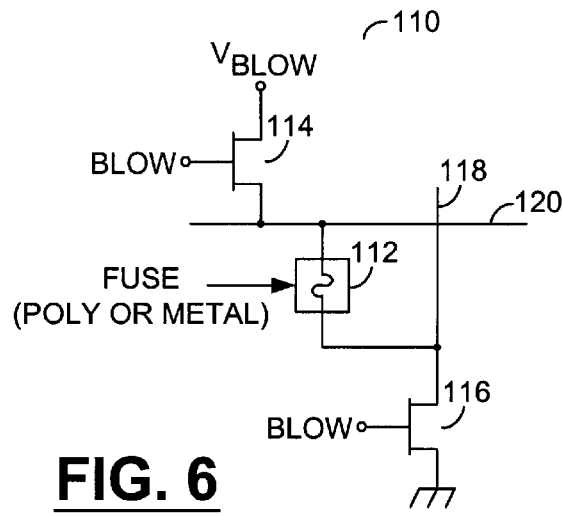
FIG. 6 is a diagram of an example of an electrically programmable fuse that may be implemented in the configurable matrix of FIG. 1.

Referring to FIG. 6, an example of an electrically programmable fuse 110 is shown. The electrically programmable fuse 110 generally comprises a fuse element 112, a transistor 114, a transistor 116, a vertical wire 118 and horizontal wire 120. When the fuse element 112 is intact, the vertical wire 118 is generally electrically connected to the horizontal wire 120. When the fuse element 112 is not intact, there is generally no electrical connection between the vertical wire 118 and the horizontal wire 120. The transistor 114 generally has a high voltage present at a source and a programming signal (e.g., BLOW) connected to a gate. When the signal BLOW is asserted, a high current is generally passed through the programming element 112, causing it to disconnect from between the vertical wire 118 and the horizontal wire 120. The transistor 116 generally provides a second high current path through the fuse element 112. The fuse element 112 may be made of a poly material or a metal material that may be blown by the application of a high voltage.

Figure 7:
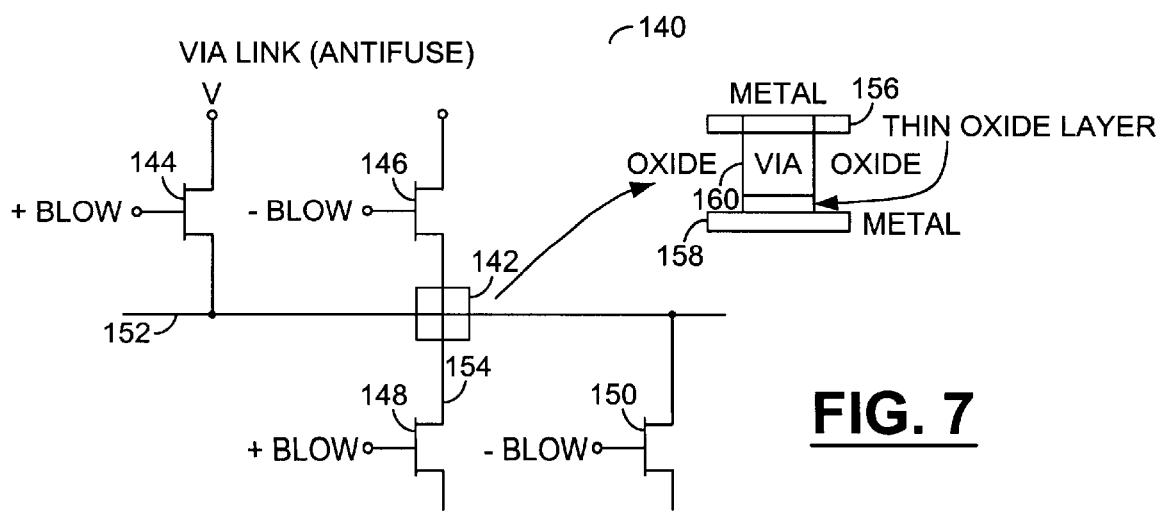
FIG. 7 is a diagram of an example of a via link or an anti-fuse that may be implemented in the configurable matrix of FIG. 1.

Referring to FIG. 7, an example of a via link (or antifuse) 140 is shown. The via link 140 generally comprises a programming element 142, a transistor 144, a transistor 146, a transistor 148, a transistor 150, a horizontal wire 152 and a vertical wire 154. In general, the horizontal wire 152 and the vertical wire 154 are not electrically connected until the programming element 142 is programmed. The programming generally electrically connects the horizontal 152 with the vertical wire 154. The programming element 142 generally has a first metal layer 156 and a second metal layer 158 that may be connected with an oxide layer 160. When a high programming voltage is applied through the transistors 144, 146, 148 and 150, the metal layer 156 and the metal layer 158 are generally electrically connected, causing the horizontal wire 152 to be electrically connected with the vertical wire 154.

The programming voltage may be accomplished by applying a relatively high voltage (e.g., 8–12V depending on oxide thickness) across the programming element 142. The n-channel transistors 144, 146, 148 and 150 may be replaced with p-channel transistors with an inverted signal control signal (e.g., BLOWB). Connection is made by applying a voltage which may cause the metal layer 156 to spike through the thin oxide layer 160 to make contact with the metal layer 158 at the bottom of the programmable element 142. It may be desirable to put a current through the programmable element 142 in both a forward (i.e., +blow with the transistors 144 and 148) and reverse (e.g., −blow with the transistors 146 and 150) direction to improve the electrical properties of the connection.

Figures 8A, 8B:
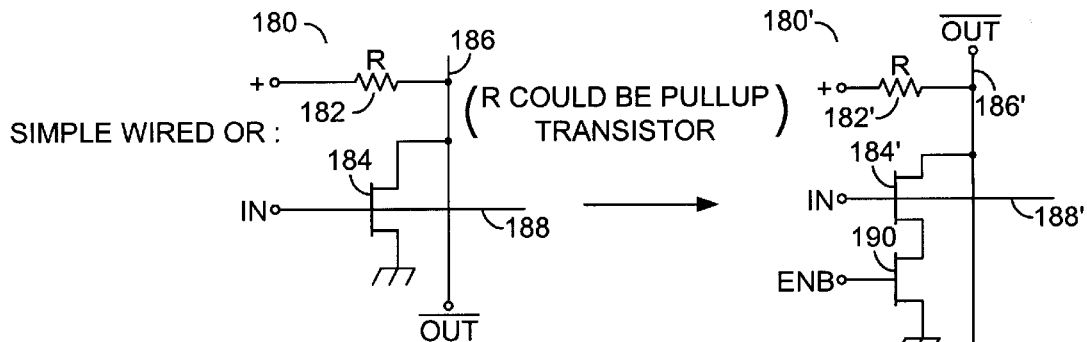
FIG. 8a and FIG. 8b are examples of switches that may be implemented in the configurable matrix of FIG. 1.

Referring to FIGS. 8a and 8b, an example of a programmable switch 180 and a programmable switch 180' is shown. The switches 180 and 180' generally comprise a load resistor 182, a transistor 184, a vertical wire 186 and a horizontal wire 188. The switch 180' generally further includes a transistor of 190. The transistor 190 may be used to enable or disable the connection between the horizontal wire 188' and the vertical wire 186 by applying a signal (e.g., ENB) to the transistor gate. In general, when the transistor 184 is in an OFF state, the vertical wire 186 is not electrically connected to the horizontal wire 188. In contrast, when the transistor 184 is ON, the vertical wire 186 is generally electrically connected to the horizontal wire 188.

Figures 9A, 9B:
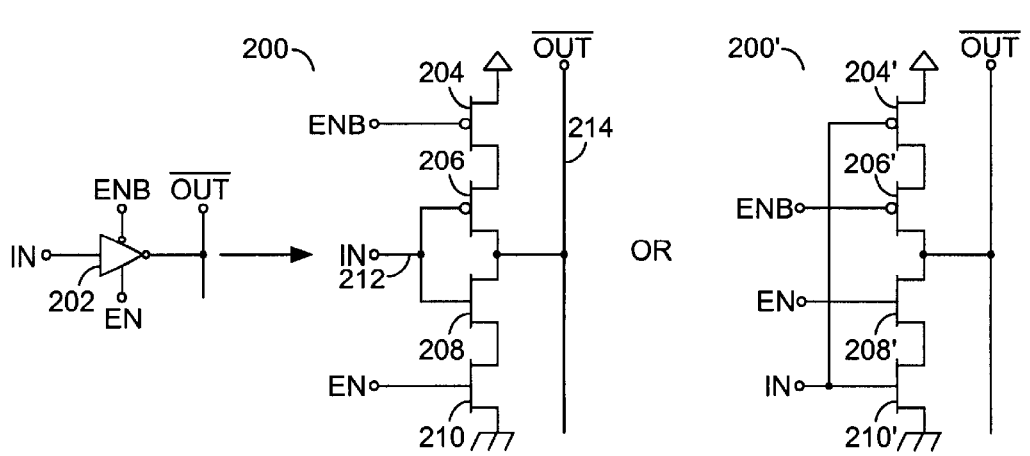
FIG. 9a and FIG. 9b illustrate examples of clocked inverters that may be implemented in the configurable matrix of FIG. 1.

Referring to FIGS. 9a and 9b, an example of a clocked inverter 200 and a clocked inverter 200' is shown. The clocked inverter 200 generally comprises an inverter element (e.g., an enabled inverter) 202 which may comprise a transistor 204, a transistor 206, a transistor 208, and a transistor 210. The transistors 204 and 206 may be implemented as p-channel transistors while the transistors 208 and 210 may be implemented as n-channel transistors. A horizontal wire 212 is generally connected with a vertical wire 214 when an enable signal (e.g., EN) is presented to the transistor 210 and an enable signal (e.g., ENB) is presented to the transistor 204. The enabled inverter 200' shows the enable signal EN presented to the transistor 208' and the enable signal ENB presented to the transistor 206'. The enabled inverter 200' may provide improved isolation between the input and the output.

Figures 10A, 10B:
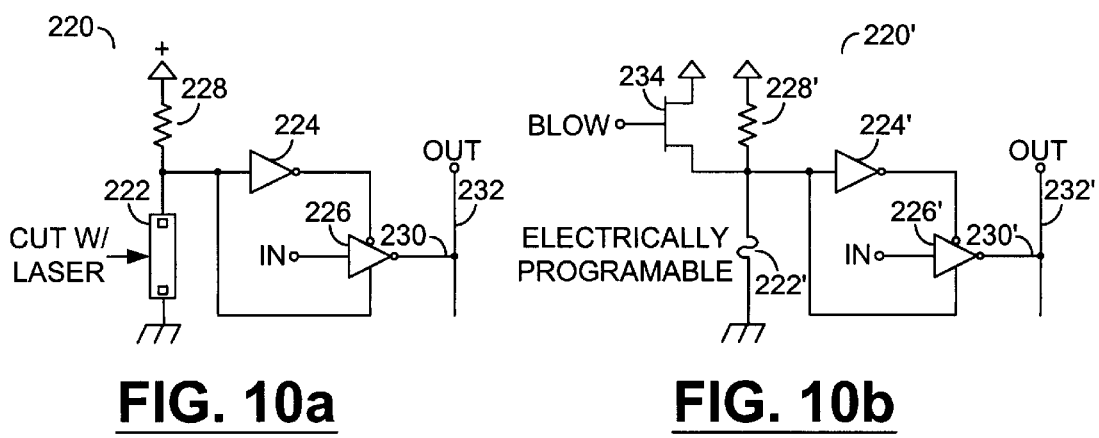
FIG. 10a and FIG. 10b illustrate examples of switches using laser fuses for control that may be implemented in the configurable matrix of FIG. 1.

Referring to FIGS. 10a and 10b, an example of a circuit 220 and a circuit 220' having a switch using the laser fuse or electrical fuse for control is shown. The circuit 200 generally comprises a laser fuse 222, an inverter 224, and an enabled inverter 226, and a load resistor 228. The laser fuse 222 may be used to control the operation of the enabled inverter 226. For example, when the laser fuse is blown, the connection between a horizontal wire 230 and a vertical wire 232 may be established. The circuit 220' generally uses an electrically programmable element 222' to program the enabled inverter 226'. A transistor 234 may be used to provide a programming voltage to the electrically programmable fuse 222'. The circuits 220 and 220' may be modified to use fuses connected to VDD, in place of GND, by using pull-downs instead of pull-ups.

Figure 11:
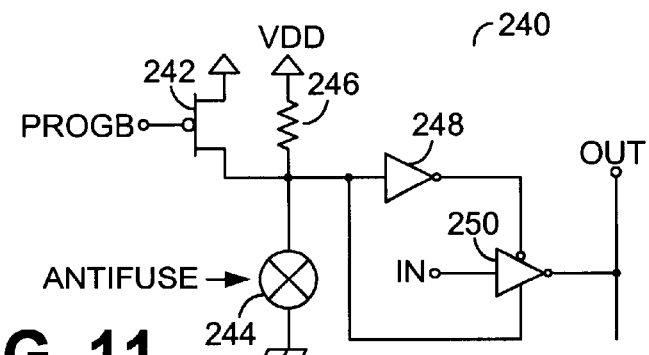
FIG. 11 illustrates an example of an antifuse with a configuration bit that may be implemented in the configurable matrix of FIG. 1.

Referring to FIG. 11, an example of an antifuse 240 having a configuration bit is shown. The antifuse 240 generally comprises a transistor 242, a fuse element 244, resistor 246, a inverter 248, and an enabled inverter 250. The transistor 242 may provide a programming voltage (e.g., VDD) to the fuse element 244 in response to a programming signal (e.g., PROGB).

Figure 12:
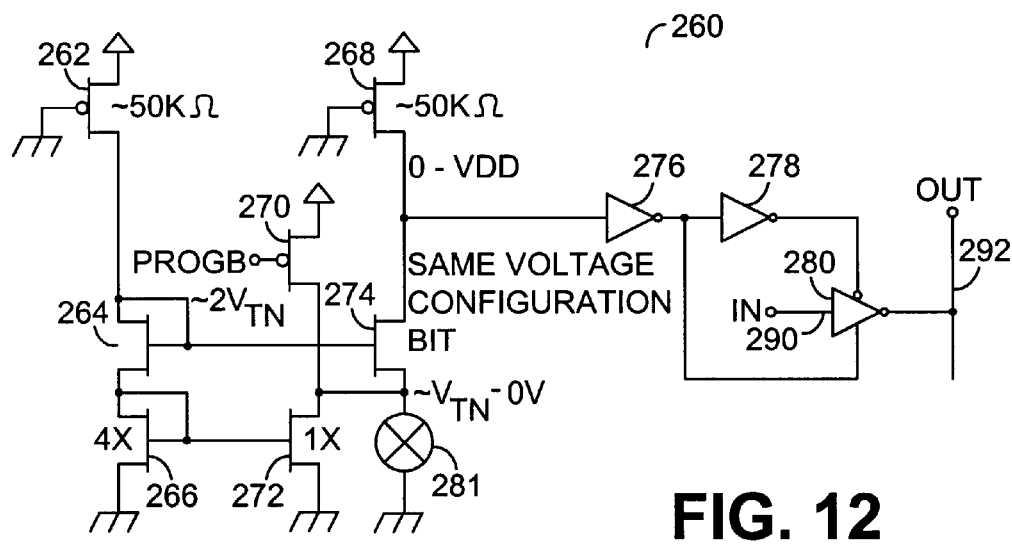
FIG. 12 illustrates an example of an advanced antifuse configuration bit that provides reduced voltage on the fuse that may be implemented in the configurable matrix of FIG. 1.

Referring to FIG. 12, an example of a circuit 260 implementing an advance antifuse configuration bit is shown. The circuit 260 generally comprises of a transistor 262, a transistor 264, a transistor 266, a transistor 268, a transistor 270, a transistor 272, a transistor 274, an inverter 276, an inverter 278, an enabled inverter 280, and an anti-fuse 281. The transistor 266 is generally sized so that the current through this transistor is four times that of the transistor 272. The signal presented by the inverter 276 may control the enabled inverter 280 that may, in turn, electrically couple a horizontal wire 290 with a vertical wire 292 such that a signal (e.g., Out) corresponds to a signal (e.g., IN). The circuit 260 may provide an advanced configuration bit that reduces voltage on the fuse element 281.

Figure 13:
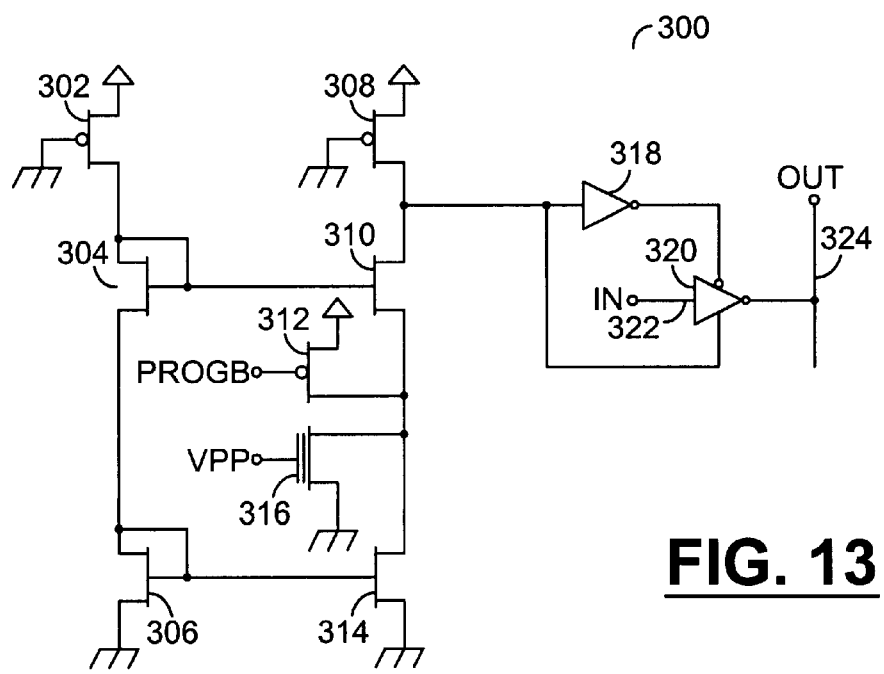
FIG. 13 illustrates an example of a floating gate EPROM or EEPROM that may be implemented in the configurable matrix of FIG. 1.

Referring to FIG. 13, an example of a circuit 300 using floating gate EPROM (or EEPROM) is shown. The circuit 300 generally comprises a transistor 302, a transistor 304, a transistor 306, a transistor 308, a transistor 310, a transistor 312, a transistor 314, a floating gate transistor 316, an inverter 318, and an enabled inverter 320. The signal presented to the inverter 318 may control the enabled inverter 320 that may, in turn, electrically couple a horizontal wire 322 with a vertical wire 324 such that the signal Out corresponds to the signal In.

In general, the circuit 10 may be configured during or after production by programming the programmable interconnections 32a–32n of the configurable matrix 14. The programmable interconnections 32a–32n may be programed by a variety of circuits and/or methods, some of which were described in detail in connection with FIGS. 5–13. However, other circuits and/or methods may be used to meet the design criteria of a particular implementation. For example, an SRAM element may be used to provide the programming signals described.

While the invention has been particularly shown and described with reference to the preferred embodiments thereof, it will be understood by those skilled in the art that various changes in form and details may be made without departing from the spirit and scope of the invention.

What is claimed is:

1. A clock generation circuit comprising:
   a logic circuit configured to generate a plurality of first signals;
   a matrix of programmable interconnections configured to (i) receive said plurality of first signals and one or more second signals and (ii) present one or more of said first signals to a phase-locked loop and one or more of said second signals to an output, in response to the programming of said programmable interconnections; and
   said phase-locked loop configured to (i) receive said one or more first signals from the matrix and (ii) present said one or more second signals to said matrix of programmable interconnections, wherein said one or more first signals control the operation of said phase-locked loop.

2. The clock generation circuit according to claim 1, wherein said logic circuit comprises a fixed logic.

3. The clock generation circuit according to claim 1, wherein said logic circuit comprises a sea of gates logic array.

4. The clock generation circuit according to claim 1, wherein said one or more first signals control one or more functions selected from the group consisting of enable logic, spread spectrum sequencing logic, operating frequency selection, output divider control, output drive control, input threshold calibration, input thresholds, output drive levels, slew rate control and/or slew rate limiting, pump current, and gain and/or range control of said clock generation circuit.

5. The clock generation circuit according to claim 1, further comprising one or more input pins configured to present one or more control signals to said matrix of interconnections, wherein said matrix is further configured to present one or more of said control signals to said phase-locked loop.

6. The clock generation circuit according to claim 5, wherein one or more of said one or more control signals enable a testing mode for said phase-locked loop.

7. The clock generation circuit according to claim 1, wherein said matrix of interconnections couples each of said one or more second signals to one or more output pins of said output.

8. The clock generation circuit according to claim 7, wherein said phase-locked loop further comprises one or more output control circuits each configured to present one of said one or more second signals in response to at least one of said one or more first signals from said matrix.

9. The clock generation circuit according to claim 8, wherein at least one of said one or more second signals is presented to at least one of said one or more output pins in response to said matrix of interconnections.

10. The clock generation circuit according to claim 1, further comprising one or more other phase-locked loops, wherein each of said one or more other phase-locked loops receives one or more of said first signals from said matrix.

11. The clock generation circuit according to claim 10, wherein each of said phase-locked loops receives either (i) the same number of said one or more first signals or (ii) a different number of said one or more first signals from said matrix.

12. The clock generation circuit according to claim 7, wherein said one or more second signals comprise either (i) one or more clock signals each having a frequency or (ii) one or more configuration parameter signals.

13. The clock generation circuit according to claim 1, wherein said matrix of interconnections comprises a plurality of programmable interconnections.

14. The clock generation circuit according to claim 13, wherein one or more of said plurality of programmable interconnections provides an electrical connection when in either (i) a programmed state or (ii) in an un-programmed state.

15. The clock generation circuit according to claim 1, wherein said one or more first signals comprise either (i) reference clock signals or (ii) control signals.

16. A clock generation circuit comprising:
   first means for generating a plurality of first signals;
   second means for (i) receiving said plurality of first signals and one or more second signals and (ii) presenting one or more of said first signals to a third means and one or more of said second signals to an output in response to a matrix of programmable interconnections within said second means, wherein said one or more first signals and one or more of said second signals are presented in response to the programming of said programmable interconnections; and
   said third means for (i) receiving said one or more first signals from said second means, (ii) presenting said one or more second signals to said matrix of programmable interconnections, and (iii) generating an output frequency in response to said one or more first signals from said second means.

17. A method for generating an output signal, comprising the steps of:
   (A) generating a plurality of first signals;
   (B) receiving said plurality of first signals and one or more second signals and presenting one or more of said first signals to a first output and one or more of said second signals to a second output in response to a matrix of programmable interconnections, wherein said one or more first signals and said one or more of said second signals are presented in response to the programming of said programmable interconnections; and
   (C) receiving said one or more first signals from said first output, presenting said one or more second signals to said matrix of programmable interconnections, and generating said one or more second signals signals from said second output as said output signal in response to said one or more first signals from said first output.

18. The method for generating an output signal according to claim 17, further comprising the step of:
   receiving one or more control signals from one or more input pins, wherein at least one of said one or more first signals comprises said one or more control signals.

19. The method according to claim 17, further comprising the step of:
   presenting said one or more second signals to said matrix of programmable interconnections, wherein one or more of said one or more second signals are connected to one or more output pins of said second output.

* * * * *